United States Patent [19]
Pai et al.

[11] Patent Number: 6,110,221
[45] Date of Patent: Aug. 29, 2000

[54] REPEATER BLOCKS ADJACENT CLUSTERS OF CIRCUITS

[75] Inventors: Yet-Ping Pai, Milpitas; Khanh Le; Kong-Fai Woo, both of San Jose, all of Calif.

[73] Assignee: Sun Microsystems, Inc., Palo Alto, Calif.

[21] Appl. No.: 08/879,660

[22] Filed: Jun. 23, 1997

[51] Int. Cl.[7] .................... G06F 17/50; H03K 19/0175; H03K 19/177; H01L 25/00

[52] U.S. Cl. ................................. 716/8; 716/14; 326/41; 326/82

[58] Field of Search .................................. 364/488–491, 364/578; 395/500.02–500.19; 340/425.1, 425.2; 326/39–41, 47, 82, 86; 716/1–21

[56] References Cited

U.S. PATENT DOCUMENTS

| | | | |
|---|---|---|---|
| 4,727,493 | 2/1988 | Taylor, Sr. | 395/500.13 |
| 4,811,237 | 3/1989 | Putatunda et al. | 395/500.1 |
| 5,119,158 | 6/1992 | Hatano | 257/203 |
| 5,144,166 | 9/1992 | Camarota et al. | 326/41 |
| 5,208,764 | 5/1993 | Rusu et al. | 395/500.09 |
| 5,410,491 | 4/1995 | Minami | 395/500.07 |
| 5,416,720 | 5/1995 | Fukui | 395/500.1 |
| 5,438,681 | 8/1995 | Mensch, Jr. | 395/500.18 |
| 5,497,108 | 3/1996 | Menon et al. | 326/84 |
| 5,774,371 | 6/1999 | Kawakami | 395/500.11 |

OTHER PUBLICATIONS

Saigo et al. ("Clock skew reduction approach for standard cell", Proceedings of the IEEE 1990 Custom Integrated Circuits Conference, May 13, 1990, pp. 16.4.1–3).

Areibi et al. ("An efficient clustering technique for circuit partitioning", 1996 IEEE International Symposium on Circuits and Systems, Circuits and Systems Connecting the World, ISCAS, vol. 4, pp. 671–674, Jan. 1, 1996).

Garbers et al. ("Finding clusters in VLSI circuits", 1990 IEEE International Conference on Computer–Aided Design–ICCAD–90, pp. 520–523, Nov. 11, 1990).

Prahlada–Rao et al. ("A genetic algorithm for channel routing using inter–cluster mutation", IEEE World Congress on Computational Intelligence, Proceedings of the First IEEE Conference on Evolutionary Computation, Jun. 27, 1994, vol. 1, pp. 97–103).

Katsadas et al. ("A multi–layer router utilizing over–cell areas", Proceedings of the 27th ACM/IEEE Design Automation Conference, Jun. 24, 1990, pp. 704–708).

Lee et al. ("HVH . . . VH multi–layer channel routing", Proceedings of the Fourth CSI/IEEE International Symposium on VLSI Design, Jan. 4, 1991, pp. 275–276).

*Primary Examiner*—Paul R. Lintz
*Assistant Examiner*—Phallaka Kik
*Attorney, Agent, or Firm*—Townsend and Townsend and Crew LLP

[57] ABSTRACT

The present invention organizes the circuits on a VLSI chip into clusters. A number of channels exist in-between the clusters. Blocks of repeaters are used in a linear array, and are placed adjacent the edges of the clusters where repeaters are estimated to be needed. The repeater cells themselves are preferably formed to have a width less than or equal to the width of a line track for routing lines such that an array of repeater cells can be lined up with an array of routing lines in a bus.

19 Claims, 7 Drawing Sheets

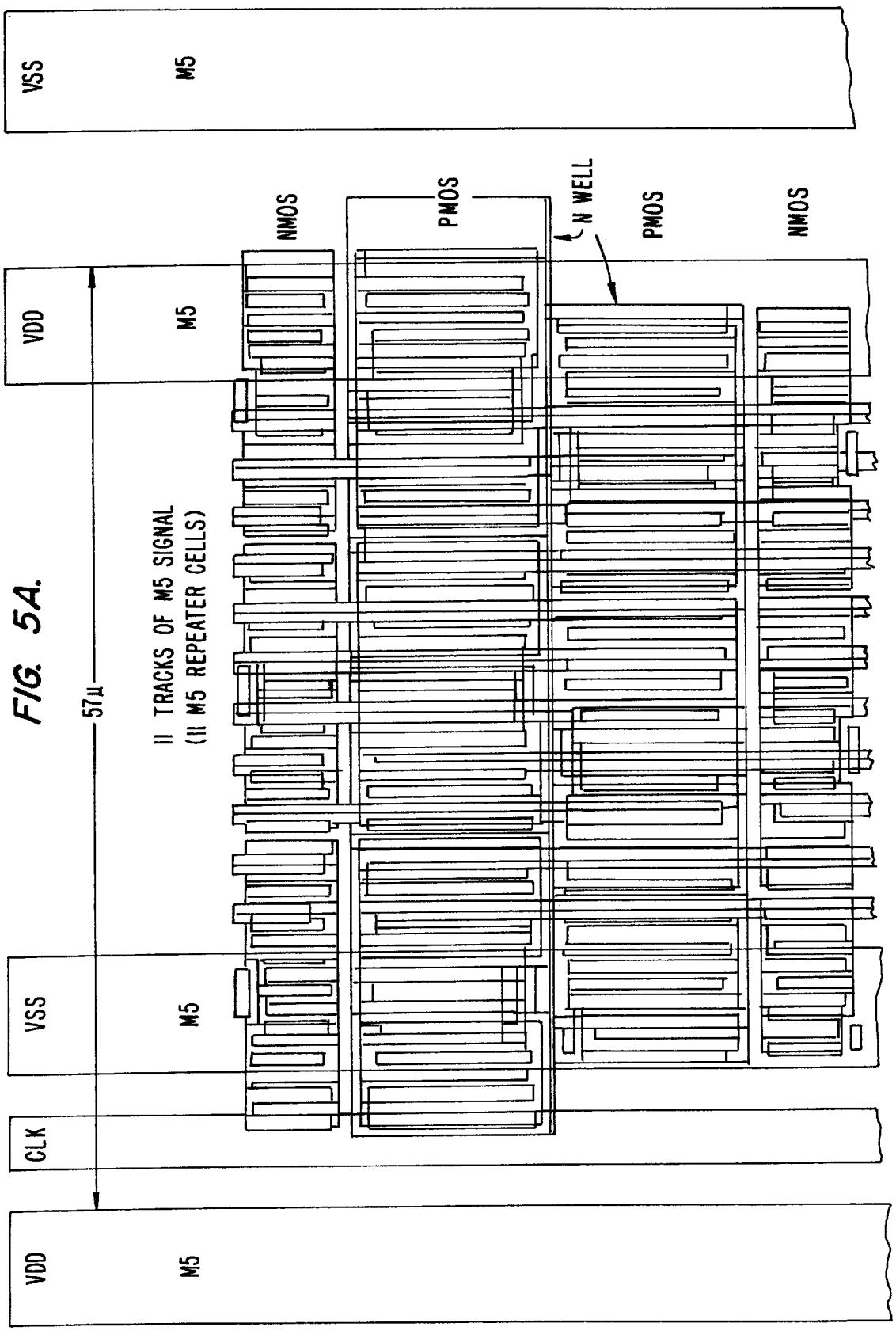

REPEATER BLOCKS ADJACENT CLUSTERS OF CIRCUITS

BACKGROUND OF THE INVENTION

The present invention relates to repeater cells in very large scale integration (VLSI) circuits, and in particular to the optimum placement of such repeater cells.

In today's high frequency VLSI chips, delays through both active gates and wires have become equally important in determining the total critical speed path delay. As process technology and supply voltage are scaled, the active gate delay comes down quickly. The gate delay can fall into the sub nano-second range easily with today's advanced processes and scaled supply voltages. On the other hand, wire delay does not scale well due to the increased coupling capacitance and the increased series resistance in finer wires.

The use of repeaters or buffers in long wires can alleviate this delay problem. The RC time constant of a long wire follows the square rule relationship with its length. Doubling the wire length quadruples the delay time at the end of the wire. On the other hand, the delay is only doubled when compared to the original wire delay (plus any added repeater gate delay) with the insertion of a repeater at the mid-point. This is an improvement in delay time when compared to the case without the use of repeaters.

Repeaters have been used recently in high frequency chip design to resolve the long wire delay problem. The procedure can be described as follows: with an existing routed chip, all long signal wires are analyzed and identified for critical nets. This can be done using a SPICE program to simulate the signal net with the proper lumped RC model. Once repeater placement is identified, they can be inserted in the signal line where they are needed. The repeater cell can reside in a standard cell block, in a data path block, or in a stand-alone repeater block. However, they all occupy extra spaces in the layout.

In a high frequency VLSI chip running above 500 Mhz the required number of repeaters is quite significant. It was estimated that more than 15,000 repeaters are needed for a chip with die size of 18 mm×18 mm, compared to a few hundred for a 200 Mhz or less chip.

The repeaters are essentially dedicated buffers which can be located at different positions on the chip. When a repeater is needed, the wire position where it is needed is broken and routed to the repeater and back. The estimated wire distance between each repeater is about 4 mm for the 500 Mhz chip. Depending on how close the repeater block happens to be, this additional wire routing can add additional delays.

SUMMARY OF THE INVENTION

The present invention organizes the circuits on a VLSI chip into clusters. A number of channels exist in-between the clusters. Blocks of repeaters are used in a linear array, and are placed adjacent the edges of the clusters where repeaters are estimated to be needed.

The repeater cells themselves are preferably formed to have a width less than or equal to the width of a line track for routing lines, such that an array of repeater cells can be lined up with an array of routing lines in a bus.

The VLSI circuit is preferably a multi-metal layer circuit, and the repeaters use only some of the metal layers, leaving at least one metal layer for the routing of other signals into and out of the clusters. In addition, preferably two separate blocks of repeaters are used. A first block is used for signal lines in the adjacent channel. A second block is used for signal lines in a higher metal layer going across the cluster area, but not connecting to gates in the cluster.

Preferably, the second type of repeaters are arranged inside of the first block. In this way, the second block utilizes an area over the cluster not used for the cluster circuitry, while the first block utilizes an area under the channel not used for the higher level metal routing, thus effectively giving two blocks of repeaters which can occupy otherwise unused edges of the clusters.

The first block of repeaters for lines into and out of the cluster has both the input and output on the same side, adjacent the channel. In this manner, lines in the channel can come into the repeater and then go out of the repeater from the same side, minimizing routing needs. Preferably, the input and output positioning of the repeater ports (such as input on the left and output on the right) is also reversible during the design phase in accordance with the direction of the signal lines needing repeating in the channel.

The second block of repeaters for the higher metal layer signal lines preferably have inputs and outputs on opposite sides, such as inputs on the cluster side and outputs on the channel side, or vice versa. These can be reversed in the design phase as needed.

For a fuller understanding of the nature and advantages of the invention, reference should be made to the following description taken in conjunction with the accompanying drawings.

BRIEF DESCRIPTION OF THE DRAWINGS

FIGS. 5a–5c are diagrams illustrating repeater cell structures.

DESCRIPTION OF THE PREFERRED EMBODIMENT

Figure 1:
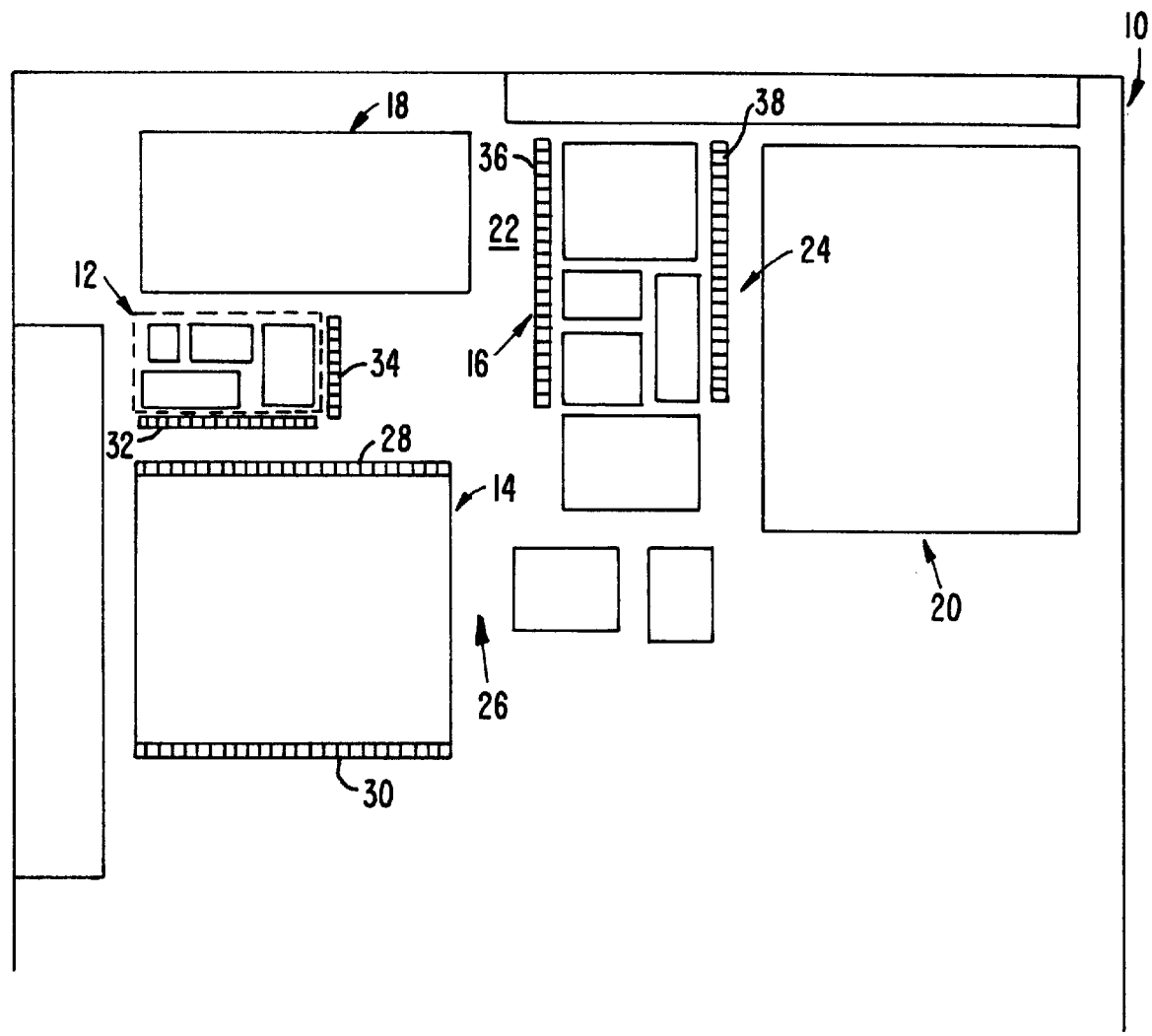
FIG. 1 is a diagram illustrating the overall architecture of a portion of a VLSI chip, showing the clusters and repeater blocks according to one embodiment of the invention.

FIG. 1 shows a VLSI chip 10, such as a microprocessor, according to the present invention. The chip is organized into a number of clusters, such as clusters 12, 14, 16, 18, and 20. The clusters can be logic blocks, memory arrays, or other grouped circuitry. In-between the clusters are channels, such as channels 22, 24, and 26.

The present invention places blocks or linear arrays of repeater cells along the edges of the clusters. For example, repeater blocks 28 and 30 are horizontal arrays on the edges of cluster 14. Cluster 12 has a horizontal repeater block 32 and a vertical repeater block 34. Cluster 16 includes vertical repeater blocks 36 and 38.

Figure 2:
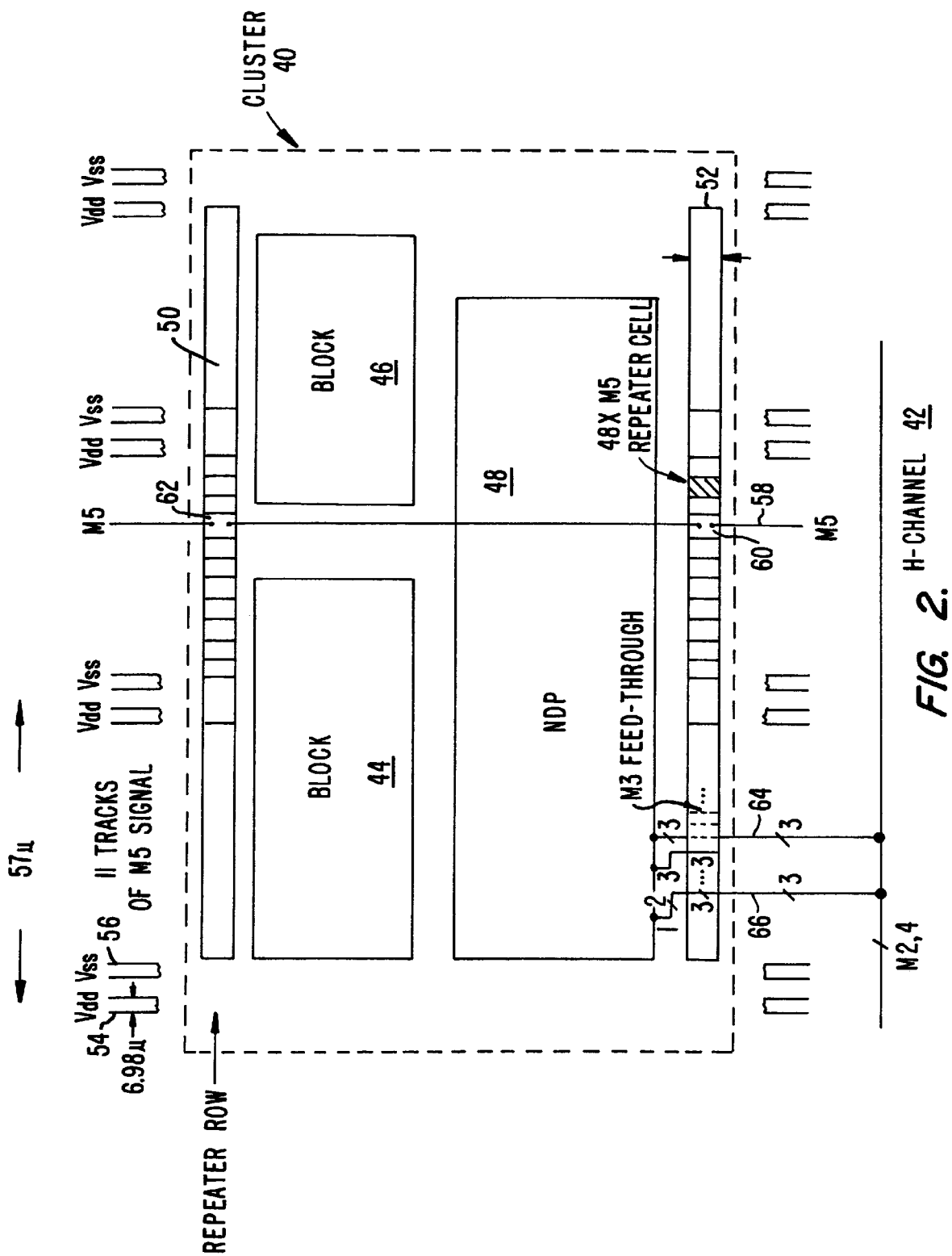
FIG. 2 illustrates one embodiment of a horizontal repeater block for a cluster in an embodiment using vertical lines in the M5 metal layer.

FIG. 2 illustrates a particular cluster 40, as indicated by the dotted line. Below the cluster a horizontal channel 42 is illustrated. The cluster includes a number of internal circuit blocks 44, 46, and 48.

The present invention adds two horizontal repeater blocks, a repeater block 50 at the top of the cluster, and a repeater block 52 at the bottom. The embodiment shown is for a VLSI circuit using six layers of metal, M1–M6 (the slashes with numbers across the lines represent the metal layers used). The first four layers of metal are used for interconnecting the circuitry within a cluster. The top two layers are used for arrays of signal lines over the chip, typically the wider signal lines used for routing of voltages.

In the embodiment shown, vertical routing lines are in the M5 layer, while the horizontal lines are in the M6 layer. Shown are illustrative voltage lines 54 and 56 in the M5 layer. A number of the lines in the M5 layer are used for signal routing, and may need repeaters. An example of the use of a repeater is shown with M5 line 58 which connects to a repeater cell 60 and another repeater cell 62. As can be seen, the repeater cells are organized so that the cells in block 52 have the input facing the channel and the output facing the cluster. In block 50, this arrangement is reversed, with the input facing the cluster and the output facing the channel. This accommodates a line 58 in which the signal propagates from bottom to top. Alternately, for a line propagating from top to bottom, the repeater cell input ports could be reversed.

The width of the repeater cell is less than or equal to the width of the track in which line 58 is located. Thus, the same number of repeater cells can be placed as the number of lines, and are aligned with the lines to allow easy routing. This eliminates the need for additional routing lines to get to a separate block of repeaters as in the prior art.

In a preferred embodiment, the repeater cells themselves are formed using metalization in layers M1 and M2. This maintains metal layer M3 open, so that routing lines that do not require repeaters can pass transparently through the area of the repeater. This is illustrated by metal 3 lines 64 and 66, which are shown passing through the area of repeater block 52 to connect to circuitry in circuit block 48. This structure provides a high degree of porosity for the repeater block, allowing sufficient feed-through tracks for internal I/O signals to pass through. Thus, normal signal flow is not blocked by the repeater placement.

Preferably, the repeater blocks are organized into subgroups. In one embodiment, the sub-group can be 11 cells which will fit into 11 tracks of the M5 signal lines. In a preferred embodiment, the tracks have a 3 micron pitch.

Figure 3:
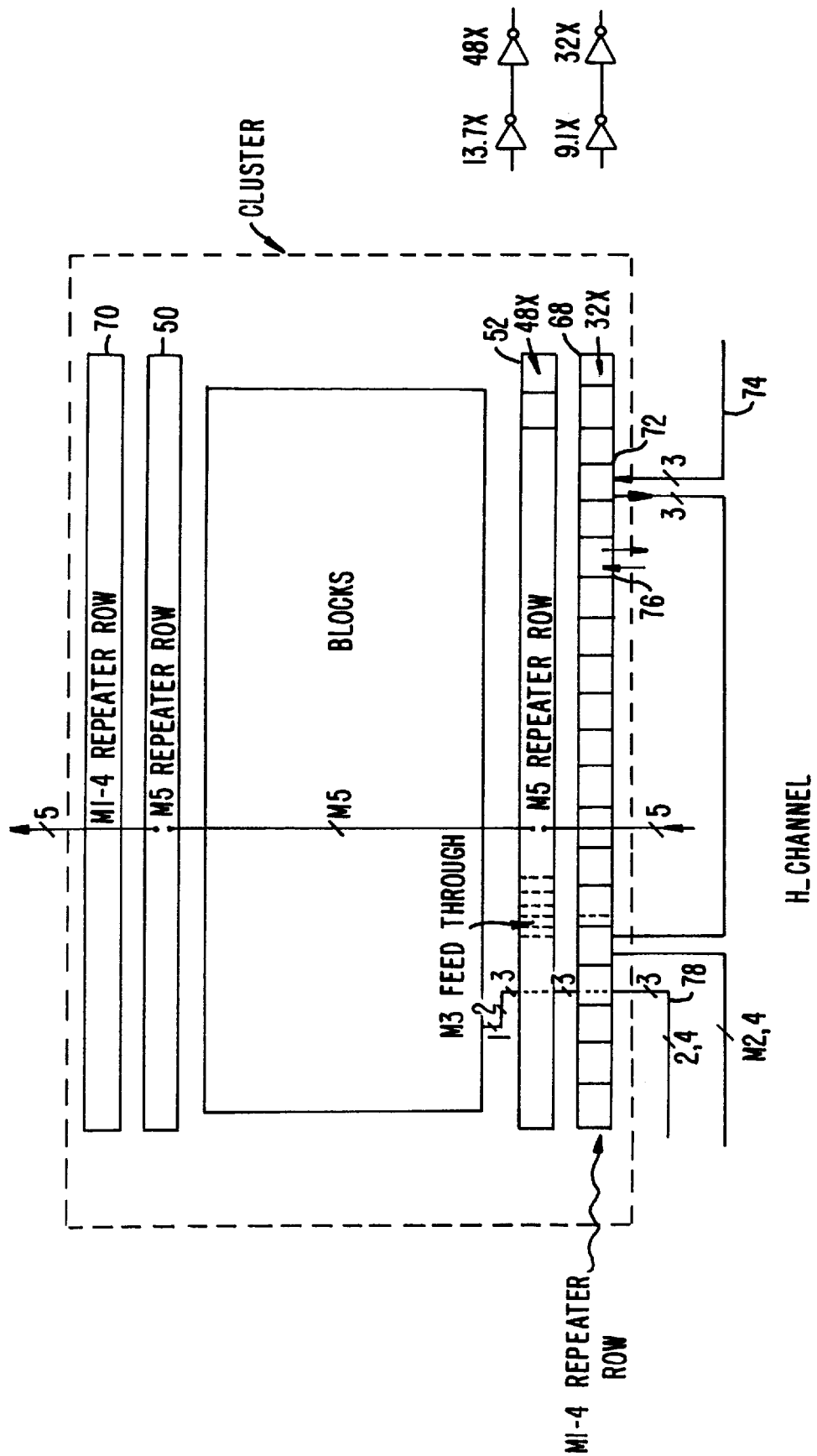
FIG. 3 is a diagram of an alternate embodiment using a first horizontal repeater block for signal lines into the cluster, and a second horizontal repeater block for the M5 metal layer.

FIG. 3 is a diagram of an alternate embodiment of the invention in which the M5 repeater blocks 52 and 50 of FIG. 2 are provided, but additionally repeater blocks 68 and 70 are also provided. Repeater blocks 68 and 70 are used for the repeater connections for signal lines in the adjacent channel. In contrast, repeater blocks 50 and 52 are used for signal lines crossing over the cluster. As can be seen from example repeater cell 72, both the input and output are on the same side of the repeater cell, contrary to repeater cell 60 of FIG. 2. In the embodiment shown, the input is on the right side and the output is on the left side, since the signal line 74 provides signals from right to left. Alternately, if the signal line 74 provided signals from left to right, the input could be designed on the left side and the output on the right side, as illustrated by the arrows on repeater cell 76.

The channel repeater blocks 68 and 70 are arranged closer to the channel than the cluster repeater blocks 50 and 52. This limits the distance lines such as line 74 have to be extended to reach the repeater block. The location of blocks 50 and 52 is less critical, since the M5 lines necessarily go across them. In addition, the repeater cells in repeater blocks 68 and 70 can be formed in the layers not used by the channel, and thus can encroach on the channel area. As illustrated, repeater block 68 also does not use level 3 metal, thus allowing an input/output line such as I/O line 78 to pass through repeater block 68 unimpeded. As explained earlier with respect to FIG. 2, the metal 3 layer is also not used for repeater block 52, thus providing the clear I/O path for line 78.

Figure 4:
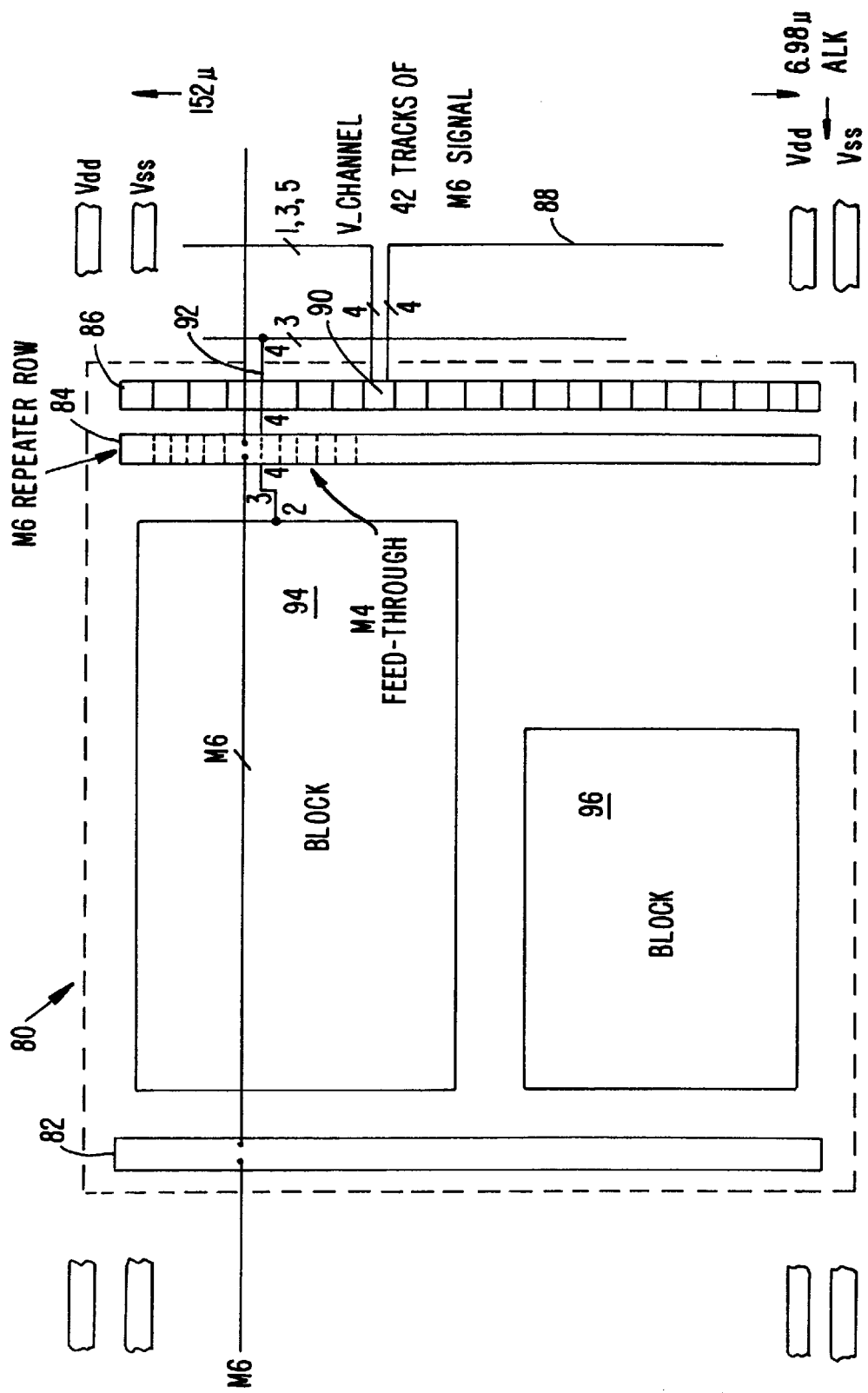
FIG. 4 is a diagram of an alternate embodiment of a pair of receiver blocks for a cluster in which the receiver blocks are arranged vertically.

FIG. 4 illustrates another cluster 80 in which the repeater blocks are vertical arrays. In particular, vertical array repeater blocks 82 and 84 are used to route the M6 metal layer lines which are horizontal. A repeater block 86 is used to route vertical channel lines, such as a line 88 which is routed to a repeater cell 90. As illustrated here, the repeater blocks do not use level 4 metal, allowing horizontal metal 4 lines, such as line 92, for I/O to the internal blocks 94 and 96 of cluster 80.

By way of example, a complex microprocessor VLSI circuit might have something on the order of 80–90 circuit blocks arranged in around 20 clusters. The M5 and M6 layers are used for supply voltages and clock signals primarily. Typically, the repeaters may be arranged at line lengths around approximately 4 mm, and the clusters are typically within 4 mm of each other.

Arranging the repeater cells in arrays allows for a more compact structure. Using standard cell designs as in the prior art uses much more area, since resources such as the power supplies are routed to each cell separately and are not shared. The arrangement in blocks in the present invention allows for the sharing of resources in a compact structure.

Figure 5B:
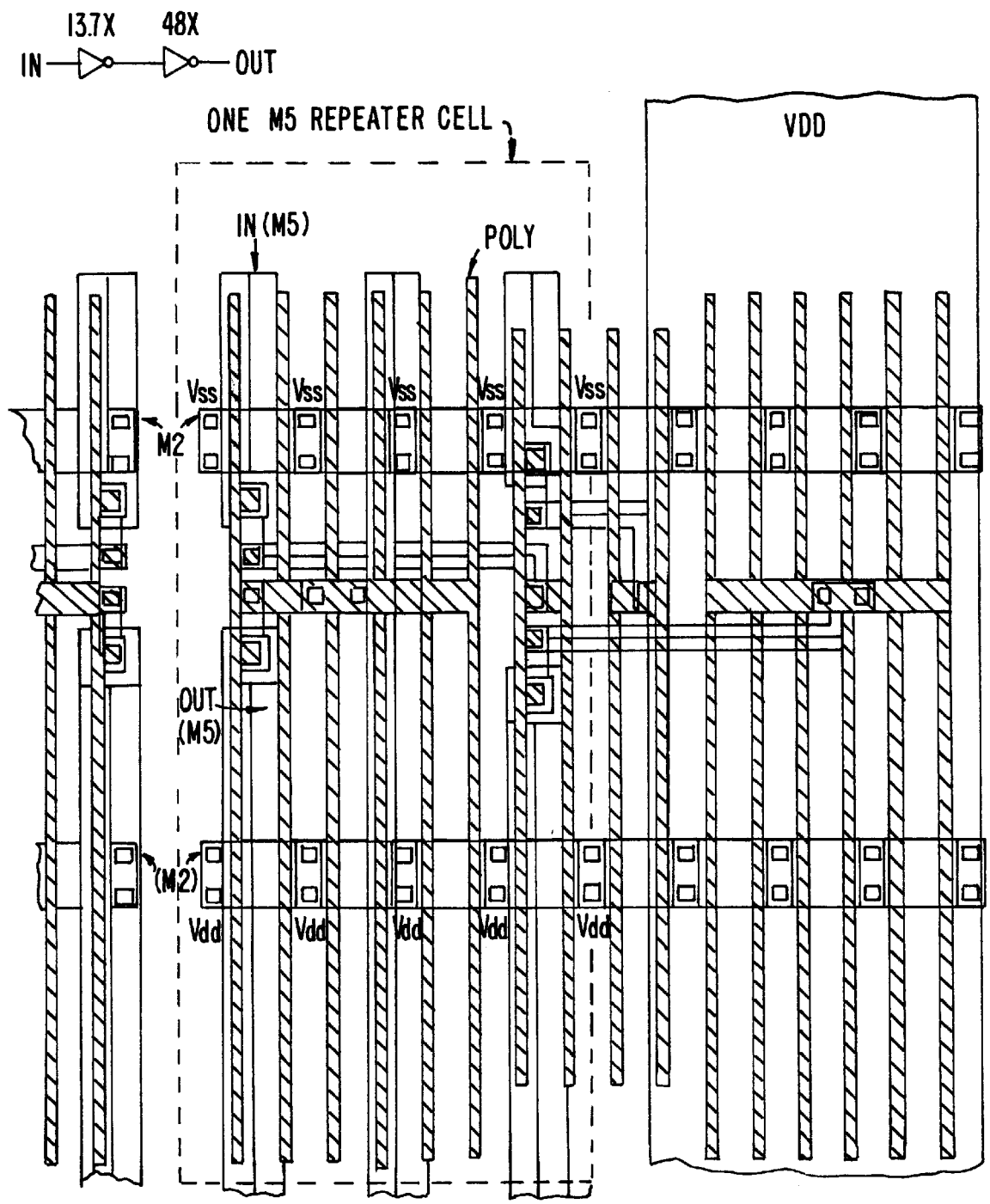
Figure 5C:
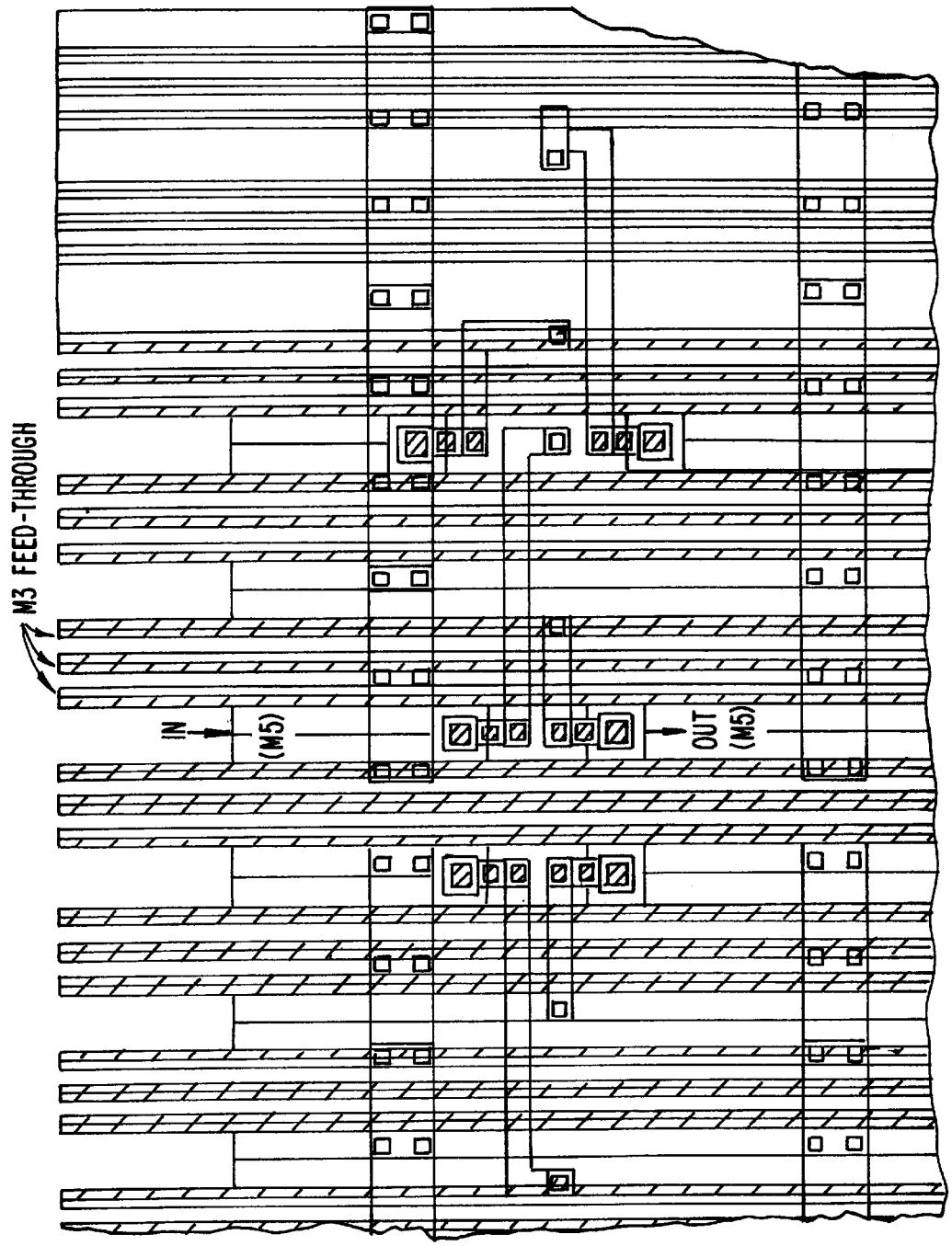

FIG. 5a shows the M5 repeater row with eleven cells. By staggering the layout and sharing the supplies, each cell can fit into the M5 signal track nicely. FIG. 5b shows the detailed layout of one repeater cell with its associated circuit diagram. FIG. 5c shows the M3 feed-through tracks available to bring in the I/O signals into the cluster.

As can be seen, the present invention provides a number of advantages.

The speed of the circuit is improved, since the wire overhead is reduced to a minimum. By placing the repeaters next to the routing channel, added wires for hooking up repeaters is kept to a minimum. This will increase the chip speed.

The present invention also limits the area needed for repeater cells. The design provides for a high density of repeater cells without creating a congestion region for signal wires. The repeater cells are laid out as basically a shallow row of buffers, with the layout partially hidden underneath the routing channel by using metal layers not used by the routing channel. This thus saves area compared to prior art approaches, and uses otherwise unused area of the chip.

The present invention also provides flexibility since the repeater blocks are formed in sub-groups in which the input and output direction can be easily changed at the last part of the design process to match with the signal flow direction in the chip floorplan. All cells in a subgroup have I/O in the same direction.

The present invention also provides a porous design for the repeater cell block. Since the repeater cells can be done using active devices in only two layers of metal, multiple metal layers can be saved for feed-through of tracks for internal I/O signals to pass to the circuit blocks in the cluster. Thus, no blocking of normal signal flow occurs. The repeater block approach of the present invention is also easily connected to other blocks with the same placement and routing software tool due to its modularity and its size matching the pitch of the routing lines. Thus, no manual repeater insertion is required. In addition, the organization into two levels of hierarchy of the repeater blocks makes the automatic routing more effective. The two levels are the repeater blocks for channel lines, and the repeater blocks for signals across or into the clusters themselves.

As will be understood by those of skill in the art, the present invention may be embodied in other specific forms without departing from the spirit or essential characteristics thereof. For example, the repeater blocks could be separated to allow for I/O lines in architectures with a limited number of metal layers. Accordingly, the foregoing description is intended to be illustrative, but not limiting, of the scope of the invention which is set forth in the following claims.

What is claimed is:

1. A VLSI circuit comprising:
   a plurality of clusters of circuits;
   a plurality of routing channels between said clusters of circuits;
   a plurality of blocks of repeaters inside said clusters; and
   a plurality of said blocks of repeaters being adjacent edges of said clusters and edges of said channels.

2. The circuit of claim 1 wherein said circuit includes multiple layers of metal, said block of repeaters being formed using only a portion of said layers of metal, leaving at least one layer of metal unused for routing lines between the inside of said clusters and said channels.

3. The circuit of claim 1 wherein each of said repeater cells has a width of no more than a width of a routing line track.

4. The circuit of claim 1 further comprising:
   a first block of repeaters adjacent a first cluster for signal lines between said first cluster and a channel; and
   a second block of repeaters adjacent said first cluster for signal lines outside said first cluster.

5. The circuit of claim 4 wherein said first block of repeaters uses a first combination of metal layers, and said second block of repeaters uses a second combination of metal layers.

6. The circuit of claim 4 wherein said first block of repeaters is closer to said cluster than said second block of repeater cells.

7. The circuit of claim 4 wherein a plurality of repeaters in said second block of repeaters have both an input and an output port facing said channel.

8. The circuit of claim 4 wherein a plurality of repeaters in said first block have an input on a first side of said repeater, and an output on the other side of said repeater, said sides being chosen in accordance with a design direction of proximate signal lines needing repeaters.

9. The circuit of claim 4 wherein said first and second blocks of repeaters are arranged horizontally along an edge of said cluster for repeating vertical lines, and further comprising:
   a third vertical block of repeaters adjacent said first cluster for horizontal signal lines between said first cluster and a channel; and
   a fourth vertical block of repeaters adjacent said first cluster for horizontal signal lines outside said first cluster.

10. The VLSI circuit of claim I wherein a portion of said blocks of repeaters is underneath said channels.

11. A VLSI circuit comprising:
    a plurality of clusters of circuits;
    a plurality of routing channels between said clusters of circuits;
    a first block of repeaters inside and adjacent an edge of a first cluster for signal lines between said first cluster and a channel;
    a second block of repeaters inside and adjacent an edge of said first cluster for signal lines outside said first cluster;
    wherein said circuit includes multiple layers of metal, said block of repeaters being formed using only a portion of said layers of metal, leaving at least one layer of metal unused for routing lines between the inside of said clusters and said channels; and
    wherein each of said repeater cells has a width of no more than a width of a routing line track.

12. The circuit of claim 11 wherein said first block of repeaters uses a first combination of metal layers, and said second block of repeaters uses a second combination of metal layers.

13. The circuit of claim 11 wherein said first and second blocks of repeaters are arranged horizontally along an edge of said cluster for repeating vertical lines, and further comprising:
    a third vertical block of repeaters adjacent said first cluster for horizontal signal lines between said first cluster and a channel; and
    a fourth vertical block of repeaters adjacent said first cluster for horizontal signal lines outside said first cluster.

14. A method of producing a VLSI comprising the steps of:
    arranging circuits on said VLSI chip in a plurality of clusters of circuits;
    providing a plurality of routing channels between said clusters of circuits;
    providing a plurality of blocks of repeaters; and
    arranging a plurality of said blocks of repeaters to be inside said clusters and adjacent to edges of said clusters.

15. The method of claim 14 further comprising the steps of:
    forming said chip with multiple layers of metal;
    forming said block of repeaters using only a portion of said layers of metal, leaving at least one layer of metal unused for routing lines between the inside of said clusters and said channels.

16. The method of claim 14 further comprising the step of forming each of said repeater cells with a width of no more than a width of a routing line track.

17. The method of claim 14 further comprising the steps of:
    forming a first block of repeaters adjacent a first cluster for signal lines between said first cluster and a channel; and
    forming a second block of repeaters adjacent said first cluster for signal lines outside said first cluster.

18. A computer system comprising:
    a memory;
    a bus coupled to said memory; and
    a microprocessor coupled to said bus, said microprocessor including
    a plurality of clusters of circuits,
    a plurality of routing channels between said clusters of circuits,
    a plurality of blocks of repeaters, and
    a plurality of said blocks of repeaters being inside said clusters and adjacent to edges of said clusters.

19. A VLSI circuit comprising:

a plurality of clusters of circuits;

a plurality of routing channels between said clusters of circuits;

a first linear array of repeaters inside and adjacent an edge of a first cluster for signal lines crossing over without ending in said first cluster;

a second linear array of repeaters inside and adjacent an edge of said first cluster for signal lines in said channel outside said first cluster, said second linear array of repeaters having a plurality of repeaters with both an input port and an output port facing said channel;

wherein said circuit includes multiple layers of metal, each said linear array of repeaters being formed using only a portion of said layers of metal, leaving at least one layer of metal unused for routing lines between the inside of said clusters and said channels; and wherein each of said repeater cells has a width of no more than a width of a routing line track.

* * * * *